(12) United States Patent
Sugimoto et al.

(10) Patent No.: US 12,431,372 B2
(45) Date of Patent: Sep. 30, 2025

(54) HEATING DEVICE, SUBSTRATE PROCESSING SYSTEM, AND HEATING METHOD

(71) Applicant: TOKYO ELECTRON LIMITED, Tokyo (JP)

(72) Inventors: Takashi Sugimoto, Yamanashi (JP); Hiroyuki Takahashi, Yamanashi (JP); Shinya Okano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 126 days.

(21) Appl. No.: 17/347,316

(22) Filed: Jun. 14, 2021

(65) Prior Publication Data

US 2021/0398830 A1 Dec. 23, 2021

(30) Foreign Application Priority Data

Jun. 22, 2020 (JP) .................. 2020-106988

(51) Int. Cl.
*H01L 21/67* (2006.01)
*H01L 21/324* (2006.01)

(52) U.S. Cl.
CPC ...... *H01L 21/67201* (2013.01); *H01L 21/324* (2013.01); *H01L 21/67115* (2013.01)

(58) Field of Classification Search
CPC ............. H01L 21/324; H01L 21/67115; H01L 21/67098; H01L 21/67248; H01L 21/67742; H01L 21/67201; H01L 21/67167; H01L 21/67766; H01L 21/67155; H01L 21/6875
See application file for complete search history.

(56) References Cited

U.S. PATENT DOCUMENTS

| | | | | |
|---|---|---|---|---|
| 8,222,574 B2* | 7/2012 | Sorabji | ............ | H01L 21/67115 118/725 |
| 8,326,468 B2* | 12/2012 | Kondoh | ............ | H01L 21/67766 414/935 |
| 9,180,550 B2 | 11/2015 | Kusuda | | |
| 10,153,184 B2 | 12/2018 | Fuse et al. | | |
| (Continued) | | | | |

FOREIGN PATENT DOCUMENTS

| CN | 106206366 A | 12/2016 |
|---|---|---|
| JP | H11-097371 A | 4/1999 |
| (Continued) | | |

*Primary Examiner* — Mary A Wilczewski
(74) *Attorney, Agent, or Firm* — Fenwick & West LLP (57) ABSTRACT

A heating device for heating a substrate before the substrate is transferred to a processing device is provided. The heating device includes a support unit configured to support the substrate, and a heating unit including light emitting elements for emitting the light to individually heat divided regions of the substrate in plan view, the substrate being supported by the support unit. Among the light emitting elements, light outputs of light emitting elements that correspond to regions of the substrate in contact with a substrate holding portion of a transfer mechanism are higher than light outputs of light emitting elements that correspond to other regions of the substrate, the transfer mechanism being disposed outside the heating device to hold and transfer the substrate between the heating device and the processing device.

10 Claims, 9 Drawing Sheets

(56) References Cited

U.S. PATENT DOCUMENTS

| | | | |
|---|---|---|---|
| 2011/0178626 A1* | 7/2011 | Kondoh | H01L 21/67766 |
| | | | 700/108 |
| 2013/0248504 A1 | 9/2013 | Kusuda | |
| 2014/0235072 A1* | 8/2014 | Ito | H01L 21/6875 |
| | | | 392/416 |
| 2016/0351424 A1 | 12/2016 | Fuse et al. | |
| 2017/0323813 A1* | 11/2017 | Silveira | C23C 16/46 |
| 2021/0125854 A1* | 4/2021 | Han | H01L 21/6833 |
| 2021/0398830 A1* | 12/2021 | Sugimoto | H01L 21/324 |
| 2022/0093422 A1* | 3/2022 | Sugimoto | H05B 3/0047 |

FOREIGN PATENT DOCUMENTS

| | | | | |
|---|---|---|---|---|
| JP | 2005-059010 A | 3/2005 | | |
| JP | 2009-076705 A | 4/2009 | | |
| JP | 2013-197423 A | 9/2013 | | |
| KR | 100776283 B1 | 11/2007 | | |
| KR | 101438311 B1 | 9/2014 | | |
| WO | WO 2019/208568 | * 10/2019 | | H01L 21/26 |

\* cited by examiner

HEATING DEVICE, SUBSTRATE PROCESSING SYSTEM, AND HEATING METHOD

CROSS-REFERENCE TO RELATED APPLICATIONS

This application claims priority to Japanese Patent Application No. 2020-106988, filed on Jun. 22, 2020, the entire contents of which are incorporated herein by reference.

TECHNICAL FIELD

The present disclosure relates to a heating device, a substrate processing system, and a heating method.

BACKGROUND

Japanese Patent Application Publication No. 2009-76705 discloses a load-lock device for transferring a substrate between a vacuum chamber maintained in a vacuum state and a space maintained in an atmospheric pressure state. The load-lock device includes a container whose inner pressure can be switched between a pressure corresponding to the vacuum chamber and an atmospheric pressure, a first opening/closing mechanism configured to be opened and closed between the container and the vacuum chamber, and a second opening/closing mechanism configured to be opened and closed between the container and the space maintained in the atmospheric pressure state. Further, the load-lock device includes a pressure adjusting mechanism configured to adjust a pressure in the container to a vacuum level when the first opening/closing mechanism is opened and the container communicates with the vacuum chamber and to adjust a pressure in the container to the atmospheric pressure when the second opening/closing mechanism is opened and the container communicates with the space maintained in the atmospheric atmosphere. Further, the load-lock device includes a substrate support disposed in the container to place a substrate thereon, a heating mechanism for heating the substrate placed on the substrate support. The heating mechanism has a heating source on which a solid light emitting element is mounted.

SUMMARY

The technique of the present disclosure ensures, in the case where a substrate is pre-heated outside a processing device and the heated substrate is held and transferred by a transfer mechanism to the processing device, in-plane uniformity of a temperature of the substrate that has reached the processing device.

In accordance with an aspect of the present disclosure, there is provided a heating device for heating a substrate before the substrate is transferred to a processing device, the heating device including: a support unit configured to support the substrate; and a heating unit including light emitting elements for emitting light to individually heat divided regions of the substrate in plan view, the substrate being supported by the support unit. Among the light emitting elements, light outputs of light emitting elements that correspond to regions of the substrate in contact with a substrate holding portion of a transfer mechanism are higher than light outputs of light emitting elements that correspond to other regions of the substrate that are not in contact with the substrate holding portion of the transfer mechanism. The transfer mechanism is disposed outside the heating device to hold and transfer the substrate between the heating device and the processing device.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor device manufacturing process, a predetermined processing such as film formation or etching is performed on a substrate such as a semiconductor wafer (hereinafter referred to as "wafer") or the like.

Conventionally, in order to improve, for example, a throughput, the substrate may be heated outside a processing device that performs the above-described processing before the substrate is transferred to the processing device. That is, pre-heating may be performed outside the processing device before the substrate is transferred to the processing device. For example, in Japanese Patent Application Publication No. 2009-76705, a load-lock device for transferring a substrate between a vacuum chamber maintained in a vacuum state and a space maintained in an atmospheric pressure state includes a heating mechanism for heating a substrate. After the substrate is heated by the heating mechanism of the load-lock device, the substrate is transferred from the load-lock device to a vacuum processing device by a transfer mechanism.

In the case of performing the pre-heating outside the processing device, in order to obtain in-plane uniformity of a processing result of the processing device, it is necessary to obtain in-plane uniformity of the temperature of the substrate when the substrate has reached the processing device, for example.

However, even if the surface of the substrate is uniformly heated in a device such as the load-lock device outside the processing device, the in-plane uniformity of the temperature of the substrate deteriorates when the substrate transferred by the transfer device reaches the processing device. This is because a temperature of a substrate holding portion (s) of the transfer device where the substrate is held is lower than the temperature of the heated substrate, so that the temperature of the portion(s) of the heated substrate that is held on the substrate holding portion(s) is considerably decreased compared to other portions until the substrate is transferred to the processing device.

Therefore, the technique of the present disclosure ensures, in the case of pre-heating a substrate outside a processing device and then transferring the heated substrate held by a transfer mechanism to the processing device, in-plane uniformity of a temperature of the substrate that has reached the processing device.

Hereinafter, a heating device, a substrate processing system, and a heating method of the present embodiment will be described with reference to the accompanying drawings. Like reference numerals will be given to like parts having the substantially same functions throughout the specification and the drawings, and redundant description thereof will be omitted.

First Embodiment

Figure 1:
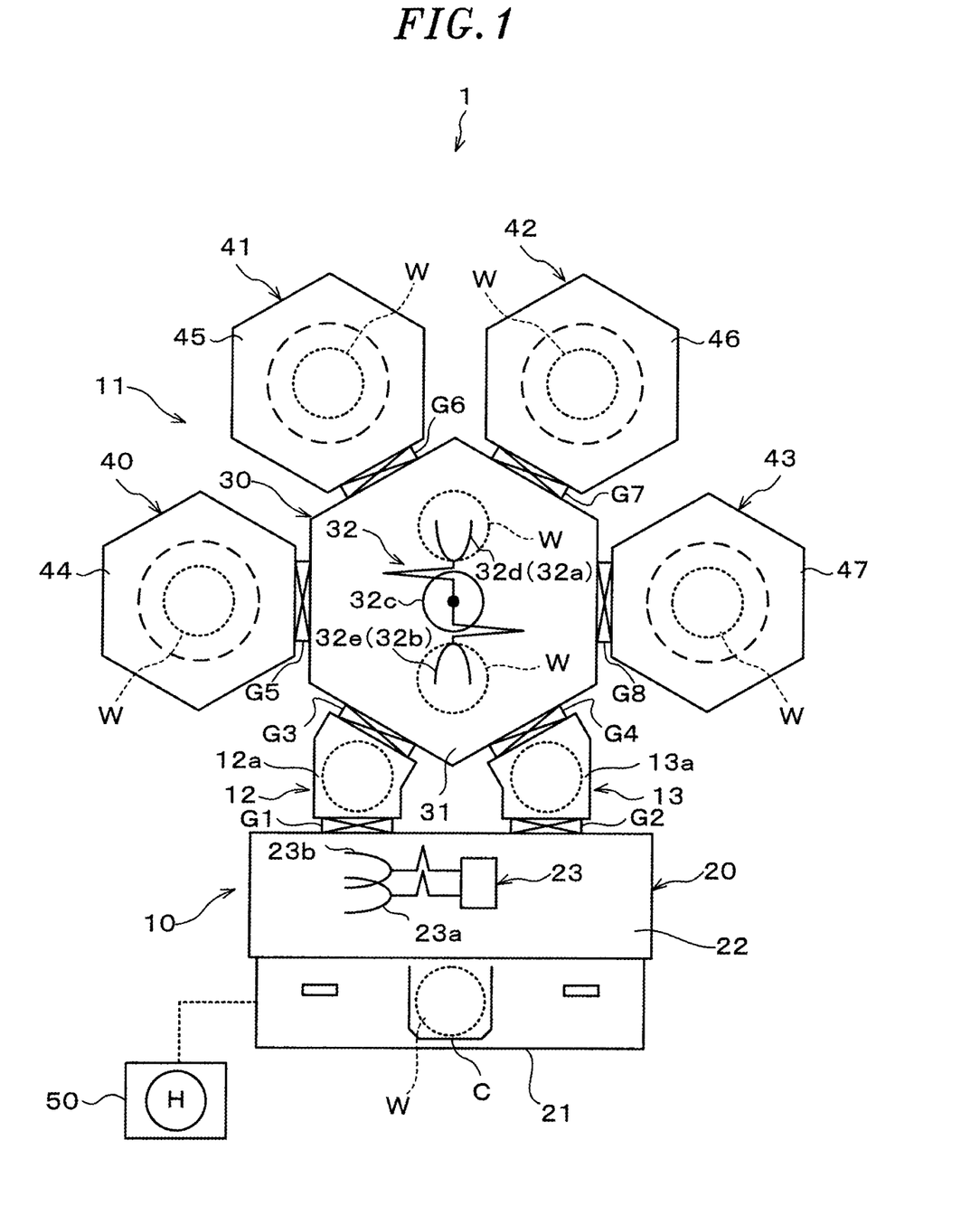
FIG. 1 is a plan view schematically showing a configuration of a wafer processing system serving as a substrate processing system according to a first embodiment.

FIG. 1 is a plan view schematically showing a configuration of a wafer processing system 1 serving as a substrate processing system according to a first embodiment. The wafer processing system 1 is configured to perform predetermined processing such as film formation, diffusion, etching, or the like on a wafer W that is a substrate under a pressure-reduced state.

The wafer processing system 1 has a configuration in which a carrier station 10 where a carrier C capable of accommodating a plurality of wafers W is loaded and unloaded and a processing station 11 provided with various processing devices for performing predetermined processing on the wafer W under a pressure-reduced state are integrally connected. The carrier station 10 and the processing station 11 are connected through two load-lock devices 12 and 13.

The load-lock devices 12 and 13 have housings forming the load-lock chambers 12a and 13a, whose inner atmosphere can be switched between an atmospheric pressure state and a vacuum state. The load-lock devices 12 and 13 connect an atmospheric transfer device 20 and a vacuum transfer device 30, which will be described later. The configurations of the load-lock devices 12 and 13 will be described in detail later.

The carrier station 10 has an atmospheric transfer device 20 and a carrier mounting table 21. The carrier station 10 may further have an aligner (not shown) for adjusting the orientation of the wafer W.

The atmospheric transfer device 20 has a housing forming an atmospheric transfer chamber 22 maintained in the atmospheric pressure state. The atmospheric transfer chamber 22 is connected to the load-lock chambers 12a and 13a of the load-lock devices 12 and 13 through gate valves G1 and G2, respectively. A transfer mechanism 23 for transferring the wafer W between the atmospheric transfer chamber 22 and the load-lock chambers 12a and 13a under the atmospheric pressure state is disposed in the atmospheric transfer chamber 22.

The transfer mechanism 23 has two transfer arms 23a and 23b. Each of the transfer arms 23a and 23b is formed as a multi joint arm having at a tip end thereof a wafer holding portion serving as a substrate holding portion for holding the wafer W. The transfer mechanism 23 is configured to hold and transfer the wafer W by using any one of the transfer arms 23a and 23b.

The carrier mounting table 21 is disposed on a side surface of the atmospheric transfer device 20 that is opposite to a side surface connected to the load-lock devices 12 and 13. In the illustrated example, a plurality of (e.g., three) carriers C can be mounted on the carrier mounting table 21. The wafer W accommodated in the carrier C mounted on the carrier mounting table 21 is loaded into and unloaded from the atmospheric transfer chamber 22 by the transfer arms 23a and 23b of the transfer mechanism 23 of the atmospheric transfer device 20.

The processing station 11 includes the vacuum transfer device 30 and processing devices 40 to 43.

The vacuum transfer device 30 includes a housing forming a vacuum transfer chamber 31 maintained in a pressure-reduced state (vacuum state). The housing can be airtightly sealed and has a polygonal shape (hexagonal shape in the illustrated example) in plan view. The vacuum transfer chamber 31 is connected to the load-lock chambers 12a and 13a of the load-lock devices 12 and 13 through gate valves G3 and G4, respectively. A transfer mechanism 32 for transferring the wafer W between the vacuum transfer chamber 31 and vacuum processing chambers 44 to 47 (to be described later) of the processing devices 40 to 43 is disposed in the vacuum transfer chamber 31.

The transfer mechanism 32 has two transfer arms 32a and 32b and a base 32c. The transfer aims 32a and 32b are formed as multi-joint arms having at tip ends thereof transfer picks 32d and 32e serving as substrate holding portions for holding the wafer W, respectively. The base 32c axially supports base portions of the transfer arms 32a and 32b. The transfer mechanism 32 is configured to hold and transfer the wafer W by using any one of the transfer arms 32a and 32b.

Figure 2:
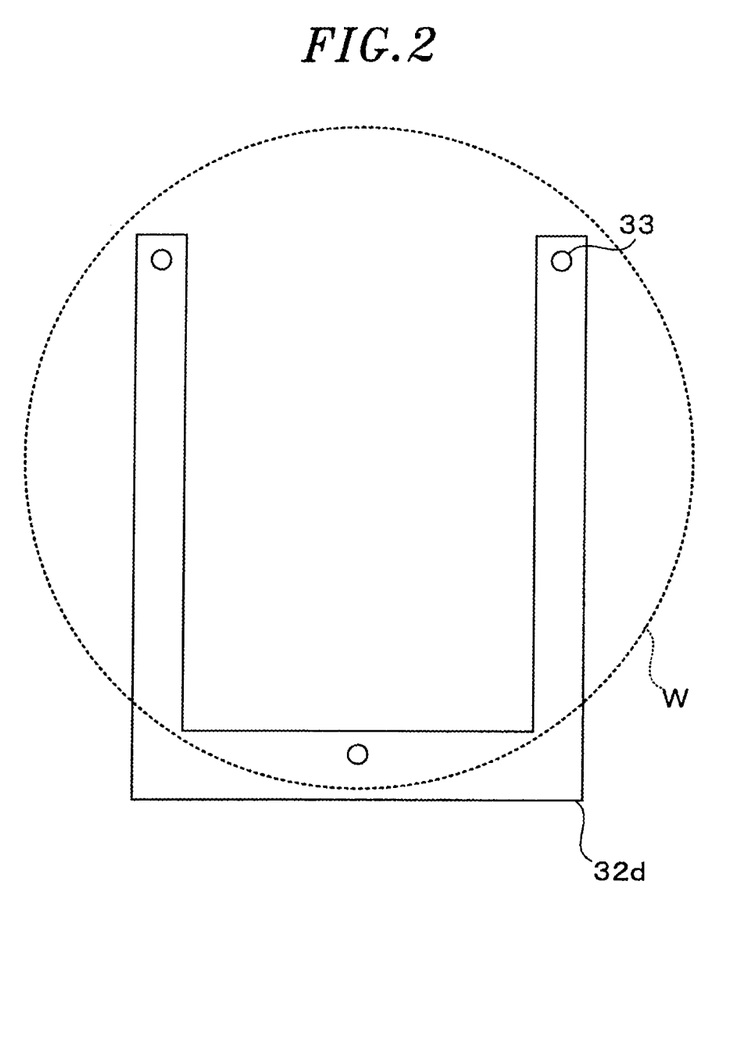
FIG. 2 is a plan view schematically showing a configuration of a transfer pick.

FIG. 2 is a plan view schematically showing a configuration of the transfer pick 32d.

As shown in FIG. 2, the transfer pick 32d is a plate-shaped member formed in a substantially U-shape in plan view. The transfer pick 32d is made of, for example, ceramic, or may be made of a metal material. Three or more (three in the illustrated example) support protrusions 33 stand upright on an upper surface of the transfer pick 32d. The support protrusions 33 are brought into contact with the backside of the wafer W when the transfer pick 32d holds the wafer W.

Since the configuration of the transfer pick 32e is the same as that of the transfer pick 32d, the description thereof will be omitted.

Referring back to FIG. 1, the processing devices 40 to 43 and the load-lock devices 12 and 13 are arranged to surround the periphery of the housing forming the vacuum transfer chamber 31 of the vacuum transfer device 30. The load-lock device 12, the processing devices 40 to 43, and the load-lock device 13 are arranged in that order in a clockwise direction in plan view to face the side surfaces of the housing forming the vacuum transfer chamber 31.

The processing devices 40 to 43 are configured to perform predetermined processing such as film formation, diffusion, etching, or the like on the wafer W under a pressure-reduced state. Further, the processing devices 40 to 43 have housings forming the vacuum processing chambers 44 to 47 where the predetemiined processing is performed on the wafer W under a pressure-reduced state. The vacuum processing chambers 44 to 47 are connected to the vacuum transfer chamber 31 of the vacuum transfer device 30 through gate valves G5 to G8 that are sluice valves, respectively.

The processing devices 40 to 43 may be selected depending on the purpose of wafer processing.

The wafer processing system 1 includes a controller 50. The controller 50 is, for example, a computer and includes a program storage unit (not shown). The program storage unit stores a program for controlling wafer processing in the wafer processing system 1. Specifically, the program storage unit stores a program for determining a transfer schedule for each wafer W, a program for determining a processing schedule for each of the processing devices 40 to 43, and the like. These programs may be stored in a computer-readable storage medium H and installed in the controller 50 from the storage medium H.

Figure 3:
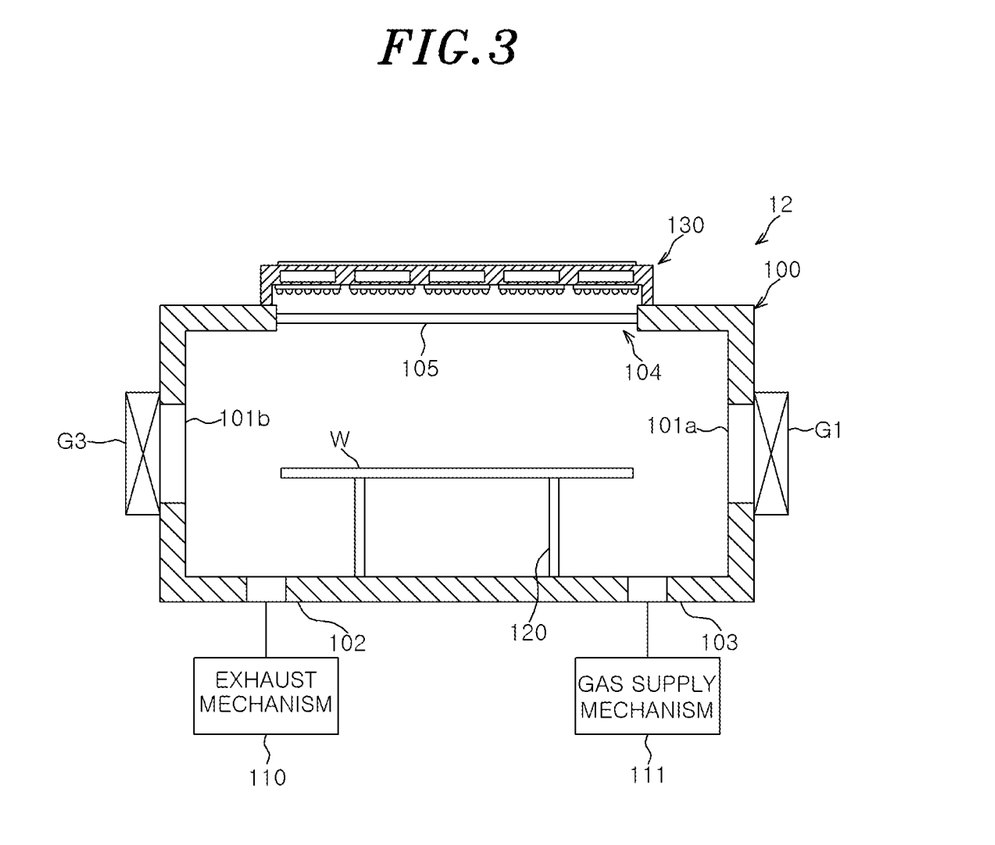
FIG. 3 is a vertical cross-sectional view schematically showing a configuration of a load-lock device.
Figure 4:
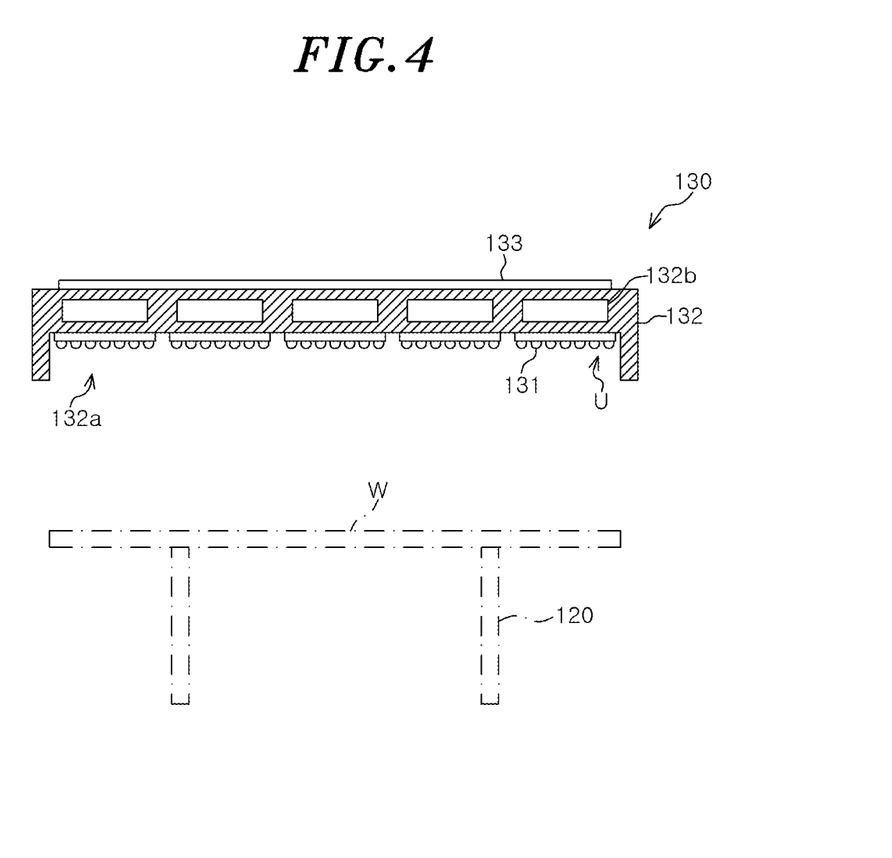
FIG. 4 is a vertical cross-sectional view schematically showing a configuration of a heating unit.
Figure 5:
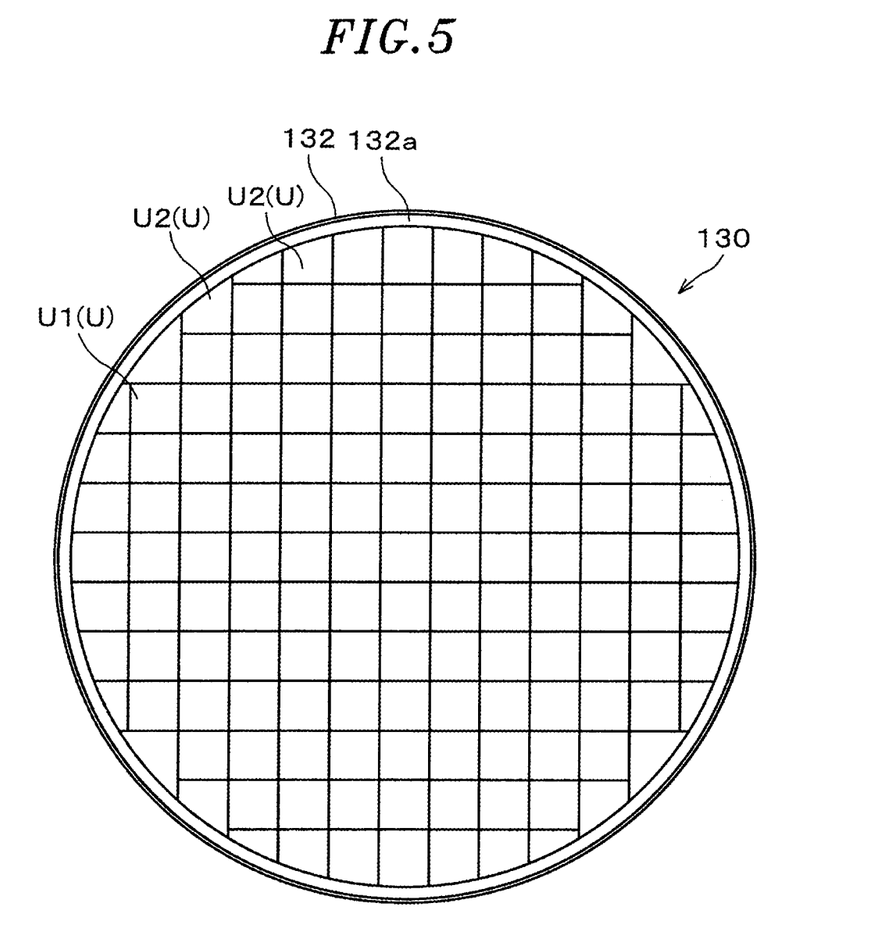
FIG. 5 is a horizontal cross-sectional view schematically showing the configuration of the heating unit.
Figure 6:
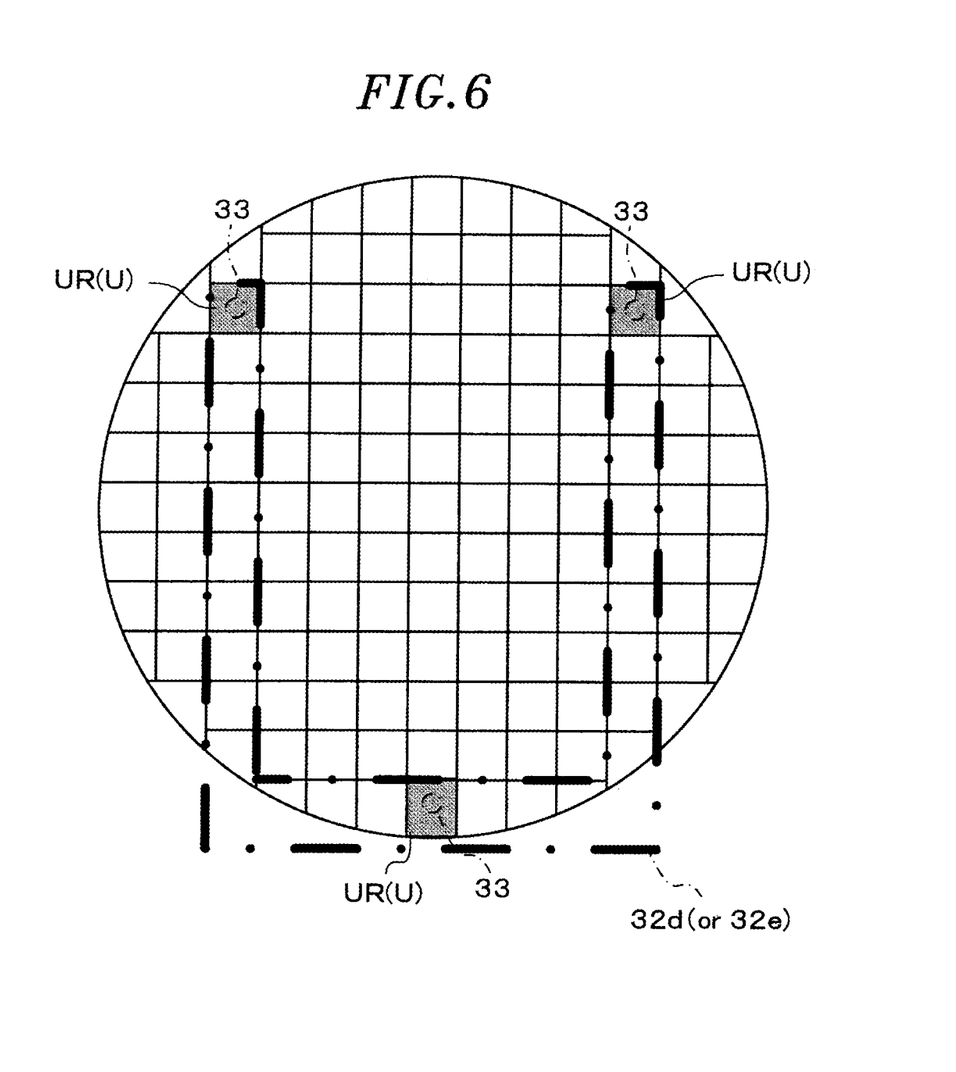
FIG. 6 is a view for explaining an example of a heating mode of the heating unit.
Figure 7:
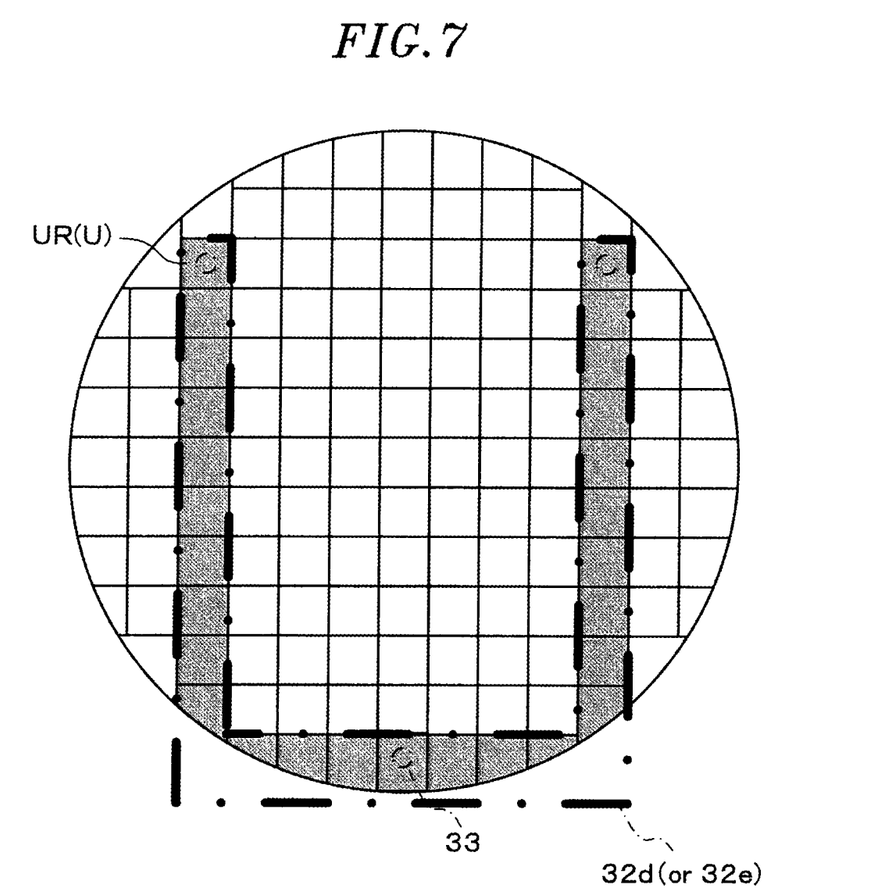
FIG. 7 is a view for explaining another example of the heating mode of the heating unit.

Next, the load-lock device 12 will be described with reference to FIGS. 3 to 7. FIG. 3 is a vertical cross-sectional view schematically showing a configuration of the load-lock device 12. FIGS. 4 and 5 are respectively a cross-sectional view and a plan view schematically showing a configuration of a heating unit to be described later. FIGS. 6 and 7 are views for explaining a heating mode of the heating unit.

As shown in FIG. 3, the load-lock device 12 has a pressure-reducible housing 100.

Loading/unloading ports 101a and 101b are formed on sidewalls of the housing 100 facing each other, and gate valves G1 and G3 are disposed at the loading/unloading ports 101a and 101b, respectively.

An exhaust port 102 for reducing a pressure in the housing 100 to a predetermined vacuum level is formed on a bottom wall of the housing 100. An exhaust mechanism 110 having a vacuum pump or the like is connected to the exhaust port 102.

Further, an air supply port 103 for returning the pressure in the housing 100 to the atmospheric pressure is formed on the bottom wall of the housing 100. A gas supply mechanism 111 for supplying an inert gas such as $N_2$ gas or the like is connected to the air supply port 103.

Further, a plurality of (e.g., three) support pins 120 serving as a support unit is disposed in the housing 100. The support pins 120 extend upward from the bottom wall of the housing 100 to support the wafer W.

Further, an opening 104 is formed at a ceiling wall of the housing 100, and an optical window 105 is disposed to block the opening 104. The optical window 105 is made of a material that transmits light from an LED to be described later.

A heating unit 130 for heating the wafer W supported by the support pins 120 with light is disposed at a position above the optical window 105 that is located outside the housing 100. The heating unit 130 is disposed to face the support pins 120 via the optical window 105.

As shown in FIG. 4, the heating unit 130 includes a plurality of LEDs 131 that are light emitting elements directed toward the wafer W. The wafer W is heated by the light from the LEDs 131. Specifically, the heating unit 130 includes a plurality of LED units U, each having the plurality of LEDs 131. The heating unit 130 further includes a base 132 on which the LED units U are mounted. As shown in FIG. 5, for example, the LED units U of the heating unit 130 include square units U1 and non-square units U2 that surround the outer periphery of the entirety of square units U1 in plan view to cover substantially the entire surface of the base 132. A mounting area on the base 132 where the LED units U are mounted is set to cover the wafer W supported by the support pins 120 in plan view Therefore, the light from the LEDs 131 of the LED units U can be irradiated to the entire wafer W supported by the support pins 120.

Each of the LEDs 131 irradiates the light toward the wafer W. For example, the LEDs 131 emit near-infrared light capable of heating a Si wafer W. The light emitted from the LEDs 131 (hereinafter, may be simply referred to as "LED light") passes through the optical window 105 and is incident on the wafer W supported by the support pins 120.

The base 132 is formed in a disc shape having a diameter slightly greater than that of the optical window 105 in plan view. The base 132 is supported by a portion of the housing 100 that surrounds the optical window 105. Further, as shown in FIG. 4, for example, the base 132 has a recess 132a formed on a surface thereof, and the LEDs 131 are disposed in the recess 132a.

In the base 132, a cooling channel 132b through which a coolant for cooling the LEDs 131 flows is formed above the recess 132a. Cooling water is used as an example of the coolant. The base 132 is made of a metal material such as Al or the like.

Further, the heating unit 130 has a control board 133 for controlling ON/OFF of the LEDs 131. The control board 133 is mounted on an upper surface of the base 132, for example.

In the heating unit 130, the control board 133 controls the ON/OFF of the LED light or the intensity of the LED light (i.e., the light output of the LEDs 131) for each LED unit U. The heating unit 130 may irradiate the LED light only to a certain region of the wafer W supported by the support pins 120, or may vary the intensity of the light depending on the region. In other words, the heating unit 130 is configured to individually heat the divided regions of the wafer W supported by the support pins 120 with the LED light in plan view. Therefore, the heating unit 130 can locally change the temperature of the wafer W supported by the support pins 120 after the heating.

For example, as shown in FIG. 6, in the heating unit 130, the control board 133 controls the light outputs of the LED units U (the units UR indicated in gray in FIG. 6) corresponding to (facing) the regions of the wafer W in contact with the support protrusions 33 of the transfer pick 32d or 32e to become higher than the light outputs of the LED units U corresponding to other regions of the wafer W. In other words, among the LED units, only the LED units U (the units UR in FIG. 6) corresponding to the regions of the wafer W in contact with the support protrusions 33 of the transfer pick 32d or 32e have a relatively high light output.

In a case where, for example, the support protrusions 33 are not formed on the upper surface of the transfer pick 32d or 32e and the wafer W is supported by substantially the entire upper surface of the transfer pick 32d or 32e, the light outputs of the LED units U are adjusted as follows. As shown in FIG. 7, the control board 133 controls the light outputs of the LED units (the units UR indicated in gray in FIG. 7) corresponding to the regions of the wafer W in contact with the upper surface of the transfer pick 32d or 32e to become higher than the light outputs of the LED units U corresponding to other regions of the wafer W.

By adjusting the light outputs of the LED units U as described above, the temperatures of the regions (hereinafter, may be referred to as "pick contact regions") in the wafer W in contact with the transfer pick 32d or 32e may become higher than those of other regions after the wafer W is heated by the heating unit 130. In particular, for example, by appropriately setting the light outputs of the LED units U corresponding to (facing) the pick contact regions, the temperatures of the pick contact regions can be increased by the amount of heat absorbed by the transfer pick 32d or 32e until the heated wafer W is transferred to any one of the processing devices 40 to 43 by the transfer mechanism 32.

Since the configuration of the load-lock device 13 is the same as that of the load-lock device 12, the description thereof will be omitted.

Next, the wafer processing performed by the wafer processing system 1 configured as described above will be described.

First, the transfer arm 23a of the transfer mechanism 23 is inserted into the carrier C to hold one wafer W. Next, the transfer arm 23a is retreated from the carrier C, and the gate valve G1 is opened. Then, the transfer arm 23a is inserted into the housing 100 of the load-lock device 12 from the atmospheric transfer device 20, and the wafer W is transferred from the transfer arm 23a to the support pins 120.

Then, the transfer arm 23a is retreated from the housing 100 of the load-lock device 12, and the gate valve G1 is closed so that the housing 100 of the load-lock device 12 is sealed and a pressure in the housing 100 is reduced. The heating unit 130 initiates the heating operation when the pressure reduction is started or after the pressure reduction is started.

Specifically, the control board 133 of the heating unit 130 switches on all the LED units U based on a heating start timing determined by the controller 50 to start the heating of the wafer W supported on the support pins 120 with the LED light. After the heating is started, e.g., when a predetermined heating time elapses, the control board 133 of the heating unit 130 switches off all the LED units U to end the heating of the wafer W by the LED light.

During the heating using the LED light, for example, the light outputs of the LED units U (the units UR in FIG. 6) corresponding to the pick contact regions of the wafer W become higher than the light outputs of the LED units U corresponding to other regions of the wafer W. Information on the LED units U corresponding to the pick contact regions is stored in advance in, e.g., a memory (not shown) of the control board 133. Further, the light output value of the LED unit U having a low output (specifically, a current value supplied to each LED 131 to obtain the low output) and the light output value of the LED unit U having a high output are predetermined by the controller 50 depending on, for example, a heating target temperature, and the light output values thereof are stored in advance in, e.g., a memory (not shown) of the control board 133.

When the heating using the heating unit 130 is completed, the gate valve G3 is opened and the load-lock device 12 communicates with the vacuum transfer device 30. Then, the transfer pick 32d of the transfer mechanism 32 is inserted into the housing 100 of the load-lock device 12, receives the wafer W from the support pins 120, and holds the wafer W. Next, the transfer pick 32d is retreated from the housing 100 of the load-lock device 12, so that the wafer W is transferred from the load-lock device 12 to the vacuum transfer device 30.

Next, the gate valve G3 is closed, and the gate valve G5 for the processing device (here, the processing device 40) is opened to perform target processing. Then, the transfer pick 32d holding the wafer W is inserted into the pressure-reduced vacuum processing chamber 44 of the processing device 40, and the wafer W is transferred to a substrate support (not shown) or the like in the vacuum processing chamber 44.

Then, the transfer pick 32d is retreated from the vacuum processing chamber 44, and the gate valve G5 is closed to seal the vacuum processing chamber 44. Next, in the vacuum processing chamber 44, the predetermined processing is performed on the wafer W at a processing temperature higher than room temperature. The temperature higher than the room temperature is, for example, 80° C. or higher. Since the technique of the present disclosure perform the heating using light to quickly heat the wafer W up to a target temperature, the technique of the present disclosure can be applied even when the processing temperature in the processing device 40 is 700° C. or higher.

After the predetermined processing is completed, the gate valve G5 is opened. Then, the transfer pick 32d is inserted into the vacuum processing chamber 44 to receive and hold the wafer W. Next, the transfer pick 32d is retreated from the vacuum processing chamber 44, so that the wafer W is transferred from the vacuum processing chamber 44 to the vacuum processing device 30. Then, the gate valve G5 is closed.

Next, the gate valve G3 is opened. Then, the transfer pick 32d is inserted into the housing 100 of the load-lock device 12, and the wafer W is transferred from the transfer pick 32d to the support pins 120. Then, the transfer pick 32d is retreated from the housing 100 of the load-lock device 12, and the gate valve G3 is closed. Then, the pressure in the housing 100 is returned to the atmospheric pressure.

Next, the gate valve G1 is opened, and the transfer aim 23a of the transfer mechanism 23 is inserted into the housing 100 of the load-lock device 12 to receive and hold the wafer W from the support pins 120. Next, the transfer arm 23a is retreated from the housing 100 of the load-lock device 12, and the gate valve G1 is closed. Then, the transfer arm 23a is inserted into the carrier C to accommodate the wafer W in the carrier C. Then, the transfer aim 23a is retreated from the carrier C. In this manner, a series of the wafer processing in the wafer processing system 1 is completed.

The series of the wafer processing is performed on, e.g., all the wafers W accommodated in the carrier C.

Figure 8:
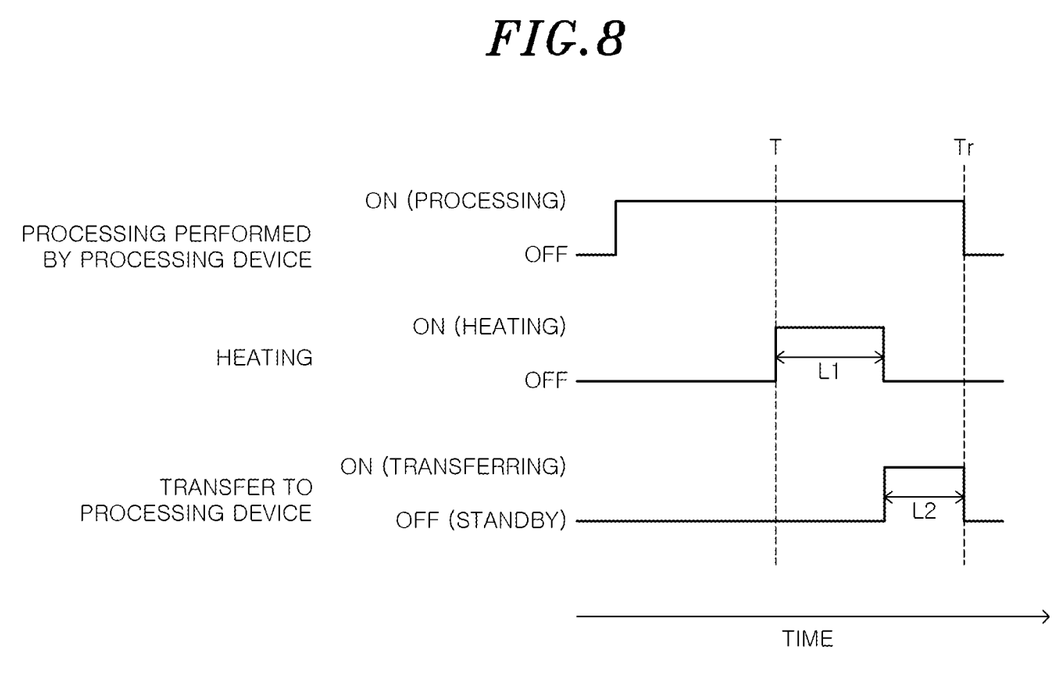
FIG. 8 is a view for explaining an example of a method for determining a heating start timing.

The heating start timing of the heating unit 130 in the series of the wafer processing is determined for each wafer W by, for example, the controller 50. Specifically, as shown in FIG. 8, the heating start timing (start time) T is determined based on, for example, the following information (1) to (3):
(1) processing end timing (end time) Tr of the processing performed on a previous wafer W by the processing device now used for a current wafer W,
(2) heating time L1,
(3) transferring time L2 required to transfer the current wafer W from the load-lock device for heating the current wafer W to the processing device for processing the current wafer W (specifically, time required to transfer the wafer W to the front of the gate valve for the processing device).

For example, the heating start timing T may be expressed by the following equation:

$$T = Tr - (L1 + L2)$$

The information (1) can be obtained from the processing schedule created by the controller 50 for each processing device. Further, the information (2) and the information (3) are stored in, e.g., a predetermined storage unit (not shown) of the controller 50. Alternatively, the information (3) may be obtained from the result actually measured at the time of production or maintenance.

As described above, in the present embodiment, each of the load-lock devices 12 and 13 includes the heating unit 130 to heat the wafer W before the wafer W is transferred to any one of the processing devices 40 to 43. The wafer W is divided into regions in plan view, and the heating unit 130 includes the LEDs 131 for emitting light to individually heat the divided regions of the wafer W supported by the support pins 120 with the light. Further, in the present embodiment, the heating unit 130 is controlled such that the light outputs of the LED units U corresponding to the pick contact regions of the wafer W (i.e., the light output of the LEDs 131) are higher than the light outputs of the LED units U corresponding to the other regions of the wafer W. Therefore, the temperatures of the pick contact regions of the wafer W can be increased in consideration of a temperature decrease caused by absorption of heat by the transfer pick 32d or 32e during the transfer of the wafer W to any one of the processing devices 40 to 43. Accordingly, in the present embodiment, the in-plane uniformity of the temperature of the wafer W that has reached any one of the processing devices 40 to 43 can be ensured. As a result, it is possible to ensure the in-plane uniformity of the processing results of the processing devices 40 to 43 while improving the throughput.

Further, in the present embodiment, the heating start timing of the heating unit 130 is determined based on the above information (1) to (3). Therefore, the time (hereinafter, referred to as "processing standby time") between when the heating unit 130 completes the heating and when any one of the processing devices 40 to 43 starts the processing can be minimized. Accordingly, it is possible to prevent the temperature of the wafer W from decreasing during the processing standby time. Hence, it is possible to ensure the in-plane uniformity of the temperature of the wafer W that has reached any one of the processing devices 40 to 43 at the target temperature with high energy efficiency.

Second Embodiment

Figure 9:
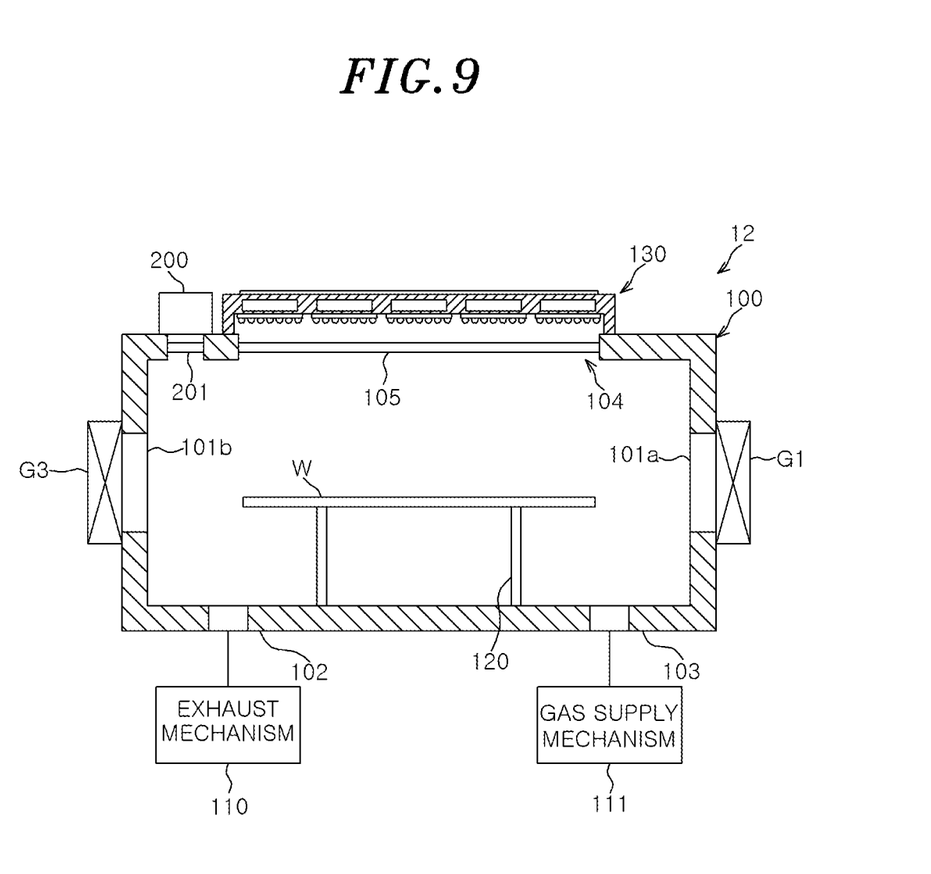
FIG. 9 is a vertical cross-sectional view schematically showing a configuration of a load-lock device serving as a heating device according to a second embodiment.

FIG. 9 is a vertical cross-sectional view schematically showing a configuration of a load-lock device serving as the heating device according to a second embodiment.

The load-lock device 12 of FIG. 9 includes a radiation thermometer 200 serving as a temperature detector, in addition to the components of the load-lock device 12 shown in FIG. 3.

The radiation thermometer 200 is configured to detect the temperature of each of the transfer picks 32d and 32e. Specifically, the radiation thermometer 200 detects the temperature of the upper surface of each of the transfer picks 32d and 32e based on the intensity of infrared rays emitted from the upper surface of each of the transfer picks 32d and 32e that are inserted into the housing 100. For example, the radiation thermometer 200 is disposed outside the housing 100 and receives the infrared rays through an optical window 201 disposed at the ceiling wall of the housing 100.

A sheet-shaped member made of a material with a greater radiation intensity change of infrared rays with respect to the temperature change than those of the material of the transfer pick 32d or 32e may be attached to the upper surface of the transfer pick 32d or 32e, and the temperature of the upper surface of the transfer pick 32d or 32e may be detected based on the intensity of the infrared rays from the sheet-shaped member.

The amount of heat absorbed from the wafer W by the transfer pick 32d or 32e varies depending on the temperature of the transfer pick 32d or 32e. Therefore, in the present embodiment, the controller 50 determines a parameter corresponding to the amount of heating by the LED units U corresponding to the pick contact regions of the wafer W based on the measurement results of the temperature of the transfer pick 32d or 32e by the radiation thermometer 200.

Specifically, for example, whenever the transfer pick 32d is inserted into the housing 100 to receive the wafer W, the temperature of the upper surface of the transfer pick 32d is measured, and the controller 50 determines the parameter based on the average of the measured temperatures on the upper surface of the transfer pick 32d.

The parameter is, for example, at least one of the light output values of the LED units U (hereinafter, referred to as "high output units U") corresponding to the pick contact regions and the heating time (i.e., the LED light irradiation time) of the high output units U.

In the case where the heating time of the high output units U is determined based on the measurement results of the radiation thermometer 200, the heating time of the LED units U (referred to as "low output units U") corresponding to other regions may be changed to be equal to the heating time of the high output units U. However, the heating time of the low output units U may be constant and and unchanged in response to the heating time of the high output units U. Further, in the case where the heating time of the low output units U is changed to be equal to the heating time of the high output units U, the optical output values of the low output units U are also changed such that the heating amount of the wafer W by the low output units U becomes the same as the heating amount before the heating time change.

(Modification)

In the above example, the heating unit 130 of each of the load-lock devices 12 and 13 heats only the wafer W. However, the present disclosure is not limited thereto, and the heating unit 130 of each of the load-lock devices 12 and 13 may heat the transfer pick 32d or 32e, and the heated transfer pick 32d or 32e may hold and transfer the wafer W to any one of the processing devices 40 to 43. Therefore, it is possible to suppress the amount of heating in consideration of a temperature decrease caused by absorption of heat by the transfer pick 32d or 32e during the transfer operation. Accordingly, it is possible to suppress the wafer W from being damaged by the heating by the heating unit 130.

Further, the heating of the transfer picks 32d and 32e with the heating units 130 of the load-lock devices 12 and 13 is performed when the wafer W is not present in the load-lock devices 12 and 13, for example. Further, for example, the transfer pick 32d may be heated by the heating unit 130 of the load-lock device 13 while the wafer W is being heated by the heating unit 130 of the load-lock device 12. Accordingly, the temperature of the heated transfer pick 32d at the time of holding the heated wafer W can become constant, and the amount of heat absorbed by the heated transfer pick 32d can be accurately predicted.

Further, in the case of heating the transfer pick 32d or 32e by the heating unit 130 of the load-lock device 12 or 13, the transfer pick 32d or 32e may be made of a material capable of efficiently absorbing the light from the LEDs 131 (e.g., the same material as that of the wafer W). Alternatively, the surface of each of the transfer picks 32d and 32e may be coated with a material capable of efficiently absorbing the light from the LEDs 131.

In the above example, each of the load-lock devices 12 and 13 constitutes a heating device that has the heating unit 130 and is configured to perform pre-heating. Instead, the heating device having the heating unit 130 may be separately provided for each of the load-lock devices 12 and 13 and connected to the vacuum transfer device 30.

In the above examples, the heating unit 130 controls the ON/OFF of the LED light or the intensity of the LED light for each LED unit U having the plurality of LEDs 131. However, the ON/OFF of the LED light or the intensity of the LED light is may also be controlled for each LED 131.

The presently disclosed embodiments are considered in all respect to be illustrative and not restrictive. The above-described embodiments can be embodied in various forms. Further, the above-described embodiments may be omitted, replaced, or changed in various forms without departing from the scope of the appended claims and the gist thereof.

The invention claimed is:

1. A heating device for heating a substrate before transferring the substrate to a processing device using a transfer mechanism, the transfer mechanism being disposed outside the heating device to hold and transfer the substrate between the heating device and the processing device, the heating device comprising:
a support unit configured to support the substrate; and
a heating unit, the heating unit including:
a base;
light emitting elements mounted on a lower surface of the base, the light emitting elements configured to emit light to individually heat divided regions of the substrate in a plan view while the substrate is supported by the support unit; and
a control board mounted on an upper surface of the base that is opposite the lower surface of the base and having a memory that is configured to store first light output values of a first subset of the light emitting elements that correspond to first regions of the substrate configured to contact substrate holding portions of the transfer mechanism and second light output values of a second subset of the light emitting elements that correspond to second regions of the substrate that are not configured to contact the transfer mechanism, the control board configured to control light outputs of the light emitting elements based on the first light output values and the second light output values stored in the memory,
wherein, the control board is configured to control, among the first subset of the light emitting elements, light outputs of the first subset of the light emitting elements that correspond to the first regions of the substrate in contact with the substrate holding portions of the transfer mechanism to be higher than light outputs of the second subset of the light emitting elements that correspond to the second regions of the substrate that are not in contact with the substrate holding portions of the transfer mechanism based on the first light output values and the second light output values stored in the memory.

2. The heating device of claim 1, wherein the processing device processes substrates sequentially, and
a timing at which the heating unit starts heating of a substrate is determined based on a timing at which processing of a previous substrate performed by the processing device is ended, a time required for the heating unit to perform the heating, and an estimated time required for the transfer mechanism to transfer the heated substrate to the processing device.

3. The heating device of claim 1, further comprising:
a temperature detector configured to detect a temperature of the substrate holding portions of the transfer mechanism,
wherein a parameter corresponding to an amount of heating by the light emitting elements corresponding to the regions of the substrate in contact with the substrate holding portions of the transfer mechanism is determined based on detection results of the temperature detector.

4. The heating device of claim 2, further comprising:
a temperature detector configured to detect a temperature of the substrate holding portions of the transfer mechanism,
wherein a parameter corresponding to an amount of heating by the light emitting elements corresponding to the regions of the substrate in contact with the substrate holding portions of the transfer mechanism is determined based on detection results of the temperature detector.

5. The heating device of claim 1, wherein the heating device is configured as a load-lock device for transferring the substrate between a space maintained in a vacuum state and a space maintained in an atmospheric pressure state.

6. The heating device of claim 2, wherein the heating device is configured as a load-lock device for transferring the substrate between a space maintained in a vacuum state and a space maintained in an atmospheric pressure state.

7. The heating device of claim 4, wherein the heating device is configured as a load-lock device for transferring the substrate between a space maintained in a vacuum state and a space maintained in an atmospheric pressure state.

8. A substrate processing system comprising:
the heating device described in claim 1;
the processing device; and
the transfer mechanism,
wherein the heating unit heats the substrate holding portions of the transfer mechanism, and
the transfer mechanism holds and transfers the substrate held by the substrate holding portions heated by the heating unit.

9. A substrate processing system comprising:
the heating device described in claim 2;
the processing device; and
the transfer mechanism,
wherein the heating unit heats the substrate holding portions of the transfer mechanism, and
the transfer mechanism holds and transfers the substrate held by the substrate holding portions heated by the heating unit.

10. A substrate processing system comprising:
the heating device described in claim 4;
the processing device; and
the transfer mechanism,
wherein the heating unit heats the substrate holding portions of the transfer mechanism, and
the transfer mechanism holds and transfers the substrate held by the substrate holding portions heated by the heating unit.

* * * * *